(12) United States Patent
Kumar et al.

(10) Patent No.: US 10,056,260 B2
(45) Date of Patent: Aug. 21, 2018

(54) SCHOTTKY DIODE WITH DIELECTRICALLY ISOLATED DIFFUSIONS, AND METHOD OF MANUFACTURING THE SAME

(71) Applicant: Vanguard International Semiconductor Corporation, Hsinchu (TW)

(72) Inventors: Manoj Kumar, Dhanbad (IN);
Hsiung-Shih Chang, Taichung (TW);
Pei-Heng Hung, New Taipei (TW);
Chia-Hao Lee, New Taipei (TW);
Jui-Chun Chang, Hsinchu (TW);
Chih-Cherng Liao, Jhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/398,999

(22) Filed: Jan. 5, 2017

(65) Prior Publication Data
US 2018/0190493 A1  Jul. 5, 2018

(51) Int. Cl.
*H01L 29/66* (2006.01)
*H01L 29/06* (2006.01)
(Continued)

(52) U.S. Cl.
CPC .... *H01L 21/2253* (2013.01); *H01L 21/26513* (2013.01); *H01L 21/28537* (2013.01);
(Continued)

(58) Field of Classification Search
CPC ........... H01L 21/2253; H01L 21/26513; H01L 21/28537; H01L 21/324; H01L 21/0435;
(Continued)

(56) References Cited

U.S. PATENT DOCUMENTS

| 7,626,243 B2 | 12/2009 | Disney et al. |
| 7,808,069 B2 * | 10/2010 | Ho .................. H01L 29/872 |
| | | 257/484 |

(Continued)

*Primary Examiner* — Marc Armand
*Assistant Examiner* — Younes Boulghassoul
(74) *Attorney, Agent, or Firm* — Birch, Stewart, Kolasch & Birch, LLP

(57) ABSTRACT

A method for manufacturing a semiconductor device includes forming a first well region in a semiconductor substrate, forming isolation structures on the semiconductor substrate, and forming second well regions and a third well region in the first well region, wherein the second well regions are isolated from the third well region by the isolation structures, and two of the adjacent second well regions have a first distance between them. The method also includes performing a rapid thermal annealing process to shorten the first distance to a second distance. The method further includes forming first barrier metal layers on the first well region and covering the second well regions, forming a second barrier metal layer on the first well region and covering the third well region, forming first electrodes on the first barrier metal layers, and forming a second electrode on the second barrier metal layer.

13 Claims, 7 Drawing Sheets

(51) Int. Cl.
*H01L 21/225* (2006.01)
*H01L 21/324* (2006.01)
*H01L 21/265* (2006.01)
*H01L 21/285* (2006.01)
*H01L 29/872* (2006.01)
*H01L 29/47* (2006.01)

(52) U.S. Cl.
CPC ........ *H01L 21/324* (2013.01); *H01L 29/0649* (2013.01); *H01L 29/47* (2013.01); *H01L 29/66143* (2013.01); *H01L 29/872* (2013.01)

(58) Field of Classification Search
CPC ........... H01L 21/0495; H01L 21/28581; H01L 21/761; H01L 21/76224; H01L 21/283; H01L 29/0649; H01L 29/47; H01L 29/66143; H01L 29/872; H01L 29/435; H01L 29/4941; H01L 29/66643; H01L 29/7839; H01L 29/806; H01L 29/812; H01L 29/66212; H01L 29/0638; H01L 29/0646; H01L 29/45; H01L 29/0619; H01L 29/0692; H01L 33/0033; H01L 51/0579; H01L 2924/12032; H01L 27/0766; H01L 21/762
USPC ....... 257/471, 475, 476, 483, 575, 557, 565, 257/E21.047, E29.338; 438/534
See application file for complete search history.

(56) References Cited

U.S. PATENT DOCUMENTS

| | | | | |
|---|---|---|---|---|
| 8,334,579 | B2* | 12/2012 | Yeh | H01L 29/0619 257/119 |
| 8,860,169 | B2* | 10/2014 | Kato | H01L 27/0629 257/471 |
| 9,634,154 | B1* | 4/2017 | Lu | H01L 29/872 |
| 9,705,010 | B2* | 7/2017 | Pang | H01L 29/872 |
| 9,711,592 | B2* | 7/2017 | Yano | H01L 29/0619 |
| 2007/0278568 | A1 | 12/2007 | Williams et al. | |
| 2009/0179222 | A1* | 7/2009 | Ker | H01L 27/0262 257/119 |
| 2013/0087828 | A1 | 4/2013 | Koshimizu et al. | |
| 2013/0193546 | A1* | 8/2013 | Webster | H01L 27/1443 257/438 |
| 2014/0061731 | A1* | 3/2014 | Chen | H01L 29/872 257/272 |
| 2014/0231961 | A1* | 8/2014 | Lin | H01L 29/73 257/565 |
| 2015/0228808 | A1* | 8/2015 | Liao | H01L 29/872 257/484 |
| 2015/0243770 | A1 | 8/2015 | Hebert et al. | |

* cited by examiner

SCHOTTKY DIODE WITH DIELECTRICALLY ISOLATED DIFFUSIONS, AND METHOD OF MANUFACTURING THE SAME

BACKGROUND OF THE INVENTION

Field of the Invention

The invention relates to semiconductor devices, and in particular to semiconductor devices formed by using a rapid thermal annealing process and methods for forming the same.

Description of the Related Art

In the traditional manufacturing processes of semiconductor devices, diffusion processes are used to make the dopants formed at the surface of the semiconductor substrates move from the high-density regions to the low-density regions, so that the dopants can be driven into the semiconductor substrates to form well regions with different conductive types (p-type or n-type). The diffusion processes may offer advantages like allowing for batch production and low-cost. However, the diffusions at the lateral edges of the well regions are not easy to control. As the size of semiconductor devices continues to shrink, the methods used to precisely control the lateral diffusion of the well regions will be issues that need to be improved.

BRIEF SUMMARY OF THE INVENTION

Embodiments of semiconductor devices, especially the Schottky diodes made by a Bipolar-CMOS-DMOS (BCD) process and methods for manufacturing the same are provided. A rapid thermal annealing (RTA) process is utilized in the present disclosure to replace the traditional diffusion process. By using a rapid thermal annealing process, lateral diffusions of the well regions in the semiconductor substrates can be precisely controlled, so that the distances between the adjacent well regions can be reduced. For example, the distances can be reduced to a range from about 0.6 µm to about 1.2 µm. In the embodiments of the above-mentioned Schottky diodes, the Schottky contact areas can be reduced, and thus the overall sizes of the Schottky diodes can be reduced. Furthermore, the reverse leakage currents of the Schottky diodes at room temperature and high temperature can also be decreased. Moreover, there is no need to use additional ion implants or masks during the manufacturing processes of the Schottky diodes.

Some embodiments of the disclosure provide a method for forming a semiconductor device. The method includes forming a first well region in a semiconductor substrate. The method also includes forming a plurality of isolation structures on the semiconductor substrate. The method further includes forming a plurality of second well regions and a third well region in the first well region, wherein the second well regions are isolated from the third well region by the isolation structures, and two of the adjacent second well regions have a first distance between them. In addition, the method includes performing a rapid thermal annealing process to shorten the first distance to a second distance. The method also includes forming a plurality of first barrier metal layers on the first well region and covering the second well regions. The method further includes forming a second barrier metal layer on the first well region and covering the third well region. In addition, the method includes forming a plurality of first electrodes on the respective first barrier metal layers, and forming a second electrode on the second barrier metal layer.

Some embodiments of the disclosure provide a semiconductor device. The semiconductor device includes a first well region disposed in a semiconductor substrate. The semiconductor device also includes a plurality of isolation structures disposed on the semiconductor substrate. The semiconductor device further includes a plurality of second well regions and a third well region disposed in the first well region, wherein the second well regions are isolated from the third well region by the isolation structures, and the distance between each two adjacent second well regions is in a range from 0.6 µm to 1.2 µm. In addition, the semiconductor device includes a plurality of first barrier metal layers disposed on the first well region and covering the second well regions. The semiconductor device also includes a second barrier metal layer disposed on the first well region and covering the third well region. The semiconductor device further includes a plurality of first electrodes disposed on the first barrier metal layers respectively, and a second electrode disposed on the second barrier metal layer.

The semiconductor device of the present disclosure may be applied to different types of semiconductor devices so that the lateral diffusion of the well regions in the semiconductor devices can be precisely controlled. In order to make the features and the advantages of the present disclosure more apparent and easy to understand, a detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
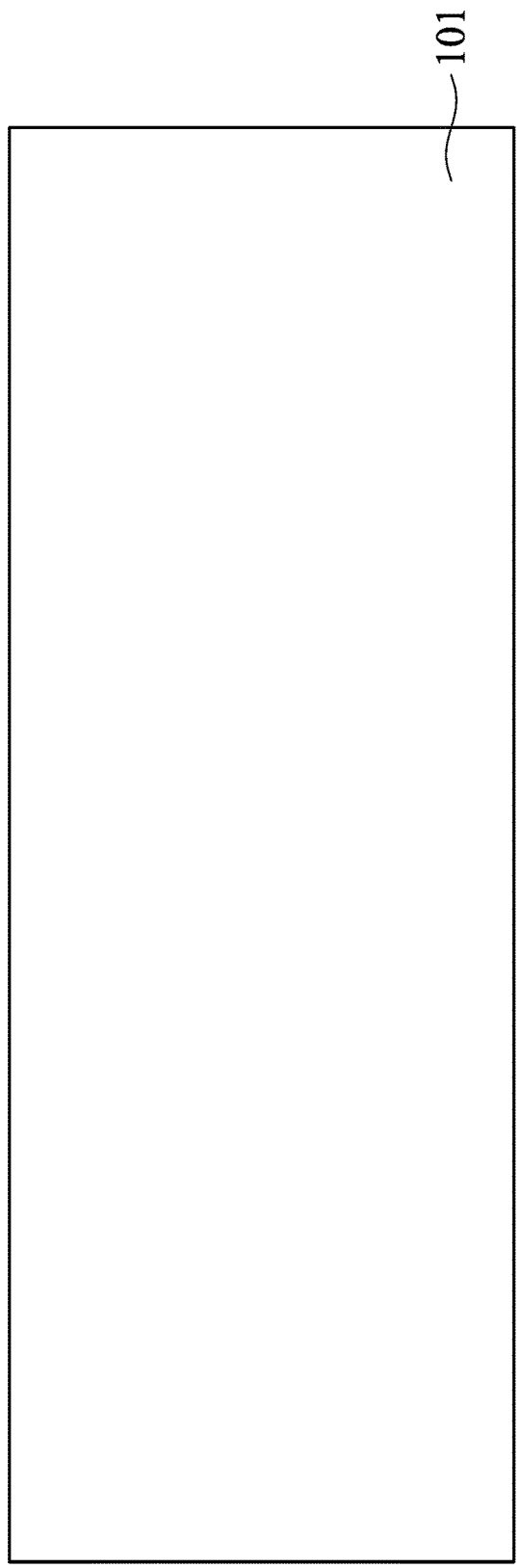
FIGS. 1 to 7 are cross-sectional views illustrating an exemplary sequential forming process of a semiconductor device in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments are described below. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a semiconductor device are provided. FIGS. 1 to 7 are cross-sectional views illustrating an exemplary sequential forming process of a semiconductor device 100 in accordance with some embodiments.

As shown in FIG. 1, a semiconductor substrate 101 is provided, in accordance with some embodiments. In some embodiments, the semiconductor substrate 101 may be made of silicon or other semiconductor materials. Alternatively, the semiconductor substrate 101 may include other elementary semiconductor materials such as germanium (Ge). In some embodiments, the semiconductor substrate 101 is made of a compound semiconductor such as silicon carbide (SiC), gallium nitride (GaN), gallium arsenic (GaAs), indium arsenide (InAs), or indium phosphide (InP). In some embodiments, the semiconductor substrate 101 is made of an alloy semiconductor such as silicon germanium, silicon germanium carbide, gallium arsenic phosphide, or gallium indium phosphide. In some embodiments, the semiconductor substrate 101 includes a silicon-on-insulator (SOI) substrate. In some embodiments, the semiconductor substrate 101 includes an epitaxial layer. For example, the semiconductor substrate 101 has an epitaxial layer overlying a bulk semiconductor. In the present embodiment, the semiconductor substrate 101 is a lightly doped p-type substrate. In other embodiments, the semiconductor substrate 101 may be a lightly doped n-type substrate.

Figure 2:
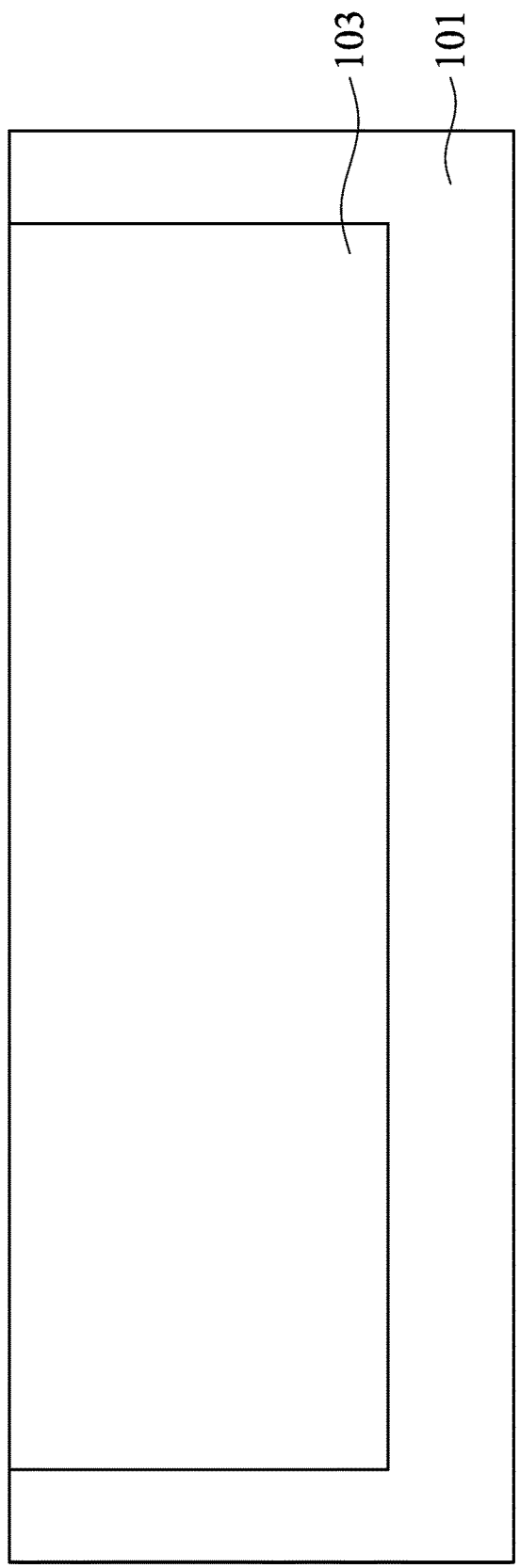

Next, as shown in FIG. 2, a first well region 103 is formed in the semiconductor substrate 101. In some embodiments, the first well region 103 is formed by an ion implantation process. N-type dopants, for example, phosphorus (P) or arsenic (As), may be doped in the semiconductor substrate 101. Alternatively, P-type dopants, for example, boron (B), may be doped in the semiconductor substrate 101. In the present embodiment, the first well region 103 is a high-voltage N-well (HVNW). In other embodiments, the first well region 103 may be a high-voltage P-well (HVPW).

Figure 3:
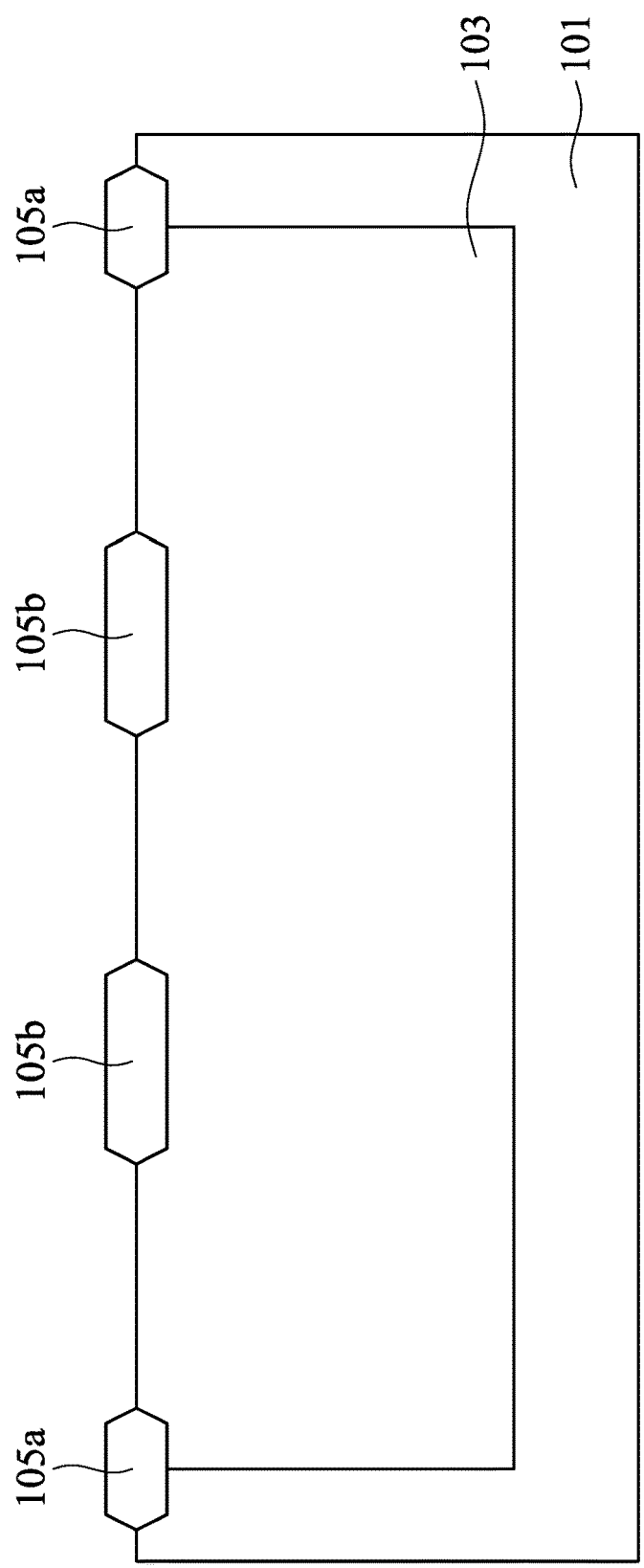

As shown in FIG. 3, some isolation structures 105a and 105b are formed on the semiconductor substrate 101, and portions of the isolation structures 105a and 105b are disposed in the semiconductor substrate 101, in accordance with some embodiments. In the present embodiment, there are four isolation structures 105a and 105b, wherein two isolation structures 105a are located above the interface of the semiconductor substrate 101 and the first well region 103, such that the active region of the semiconductor device 100 is defined. The other two isolation structures 105b are disposed on the first well region 103, and portions of the isolation structures 105b are located in the first well region 103. The above-mentioned four isolation structures 105a and 105b together define three anode/cathode electrode regions of the semiconductor device 100.

In some embodiments, the above-mentioned isolation structures 105a and 105b may be shallow trench isolation (STI) structures or local oxidation of silicon (LOCOS) isolation structures. In some embodiments, isolation structures 105a and 105b may be formed by thermal oxidation process, chemical vapor deposition process (CVD) or a combination thereof, depends on the types of the isolations.

Figure 4:
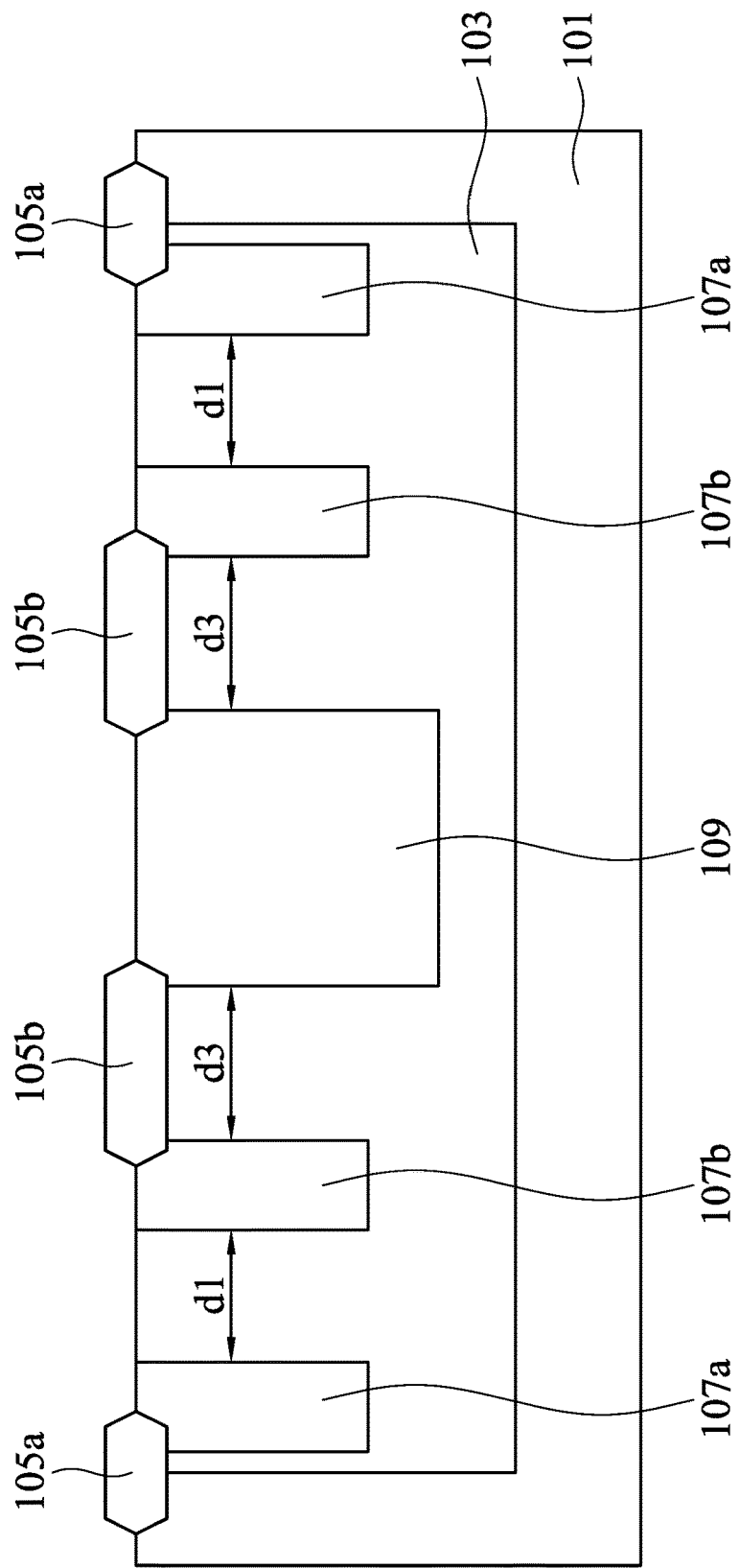

As shown in FIG. 4, second well regions 107a and 107b are formed in the first well region 103, in accordance with some embodiments. In some embodiments, there are four second well regions 107a and 107b, wherein any one isolation structure 105a and the adjacent isolation structure 105b have two second well regions 107a and 107b between them. The second well regions 107a have portions located under the isolation structures 105a, and the second well regions 107b have portions located under the isolation structures 105b. First distances d1 are defined between any two of the adjacent second well regions 107a and 107b. In some embodiments, the second well regions 107a and 107b are formed by an ion implantation process, wherein n-type or p-type dopants may be implanted into the semiconductor substrate 101 with any inclined angles by using a patterned mask. The second well regions 107a and 107b of the present embodiment are p-type well regions. In other embodiments, the second well regions 107a and 107b may be n-type well regions.

Furthermore, as shown in FIG. 4, a third well region 109 is formed in the first well region 103. In some embodiments, the third well region 109 is disposed between two adjacent isolation structures 105b, and a portion of the third well region 109 is located under the two adjacent isolation structures 105b. In some embodiments, the range of the third well region 109 is wider and deeper than the ranges of the second well regions 107a and 107b. In some embodiments, third distances d3 are defined between the third well region 109 and the adjacent second well regions 107b. In some embodiments, the third well region 109 is formed by an ion implantation process, wherein n-type or p-type dopants may be implanted into the semiconductor substrate 101 with any inclined angles by using a patterned mask. The third well region 109 of the present embodiment is an n-type well region. In other embodiments, the third well region 109 may be a p-type well region.

Figure 5:
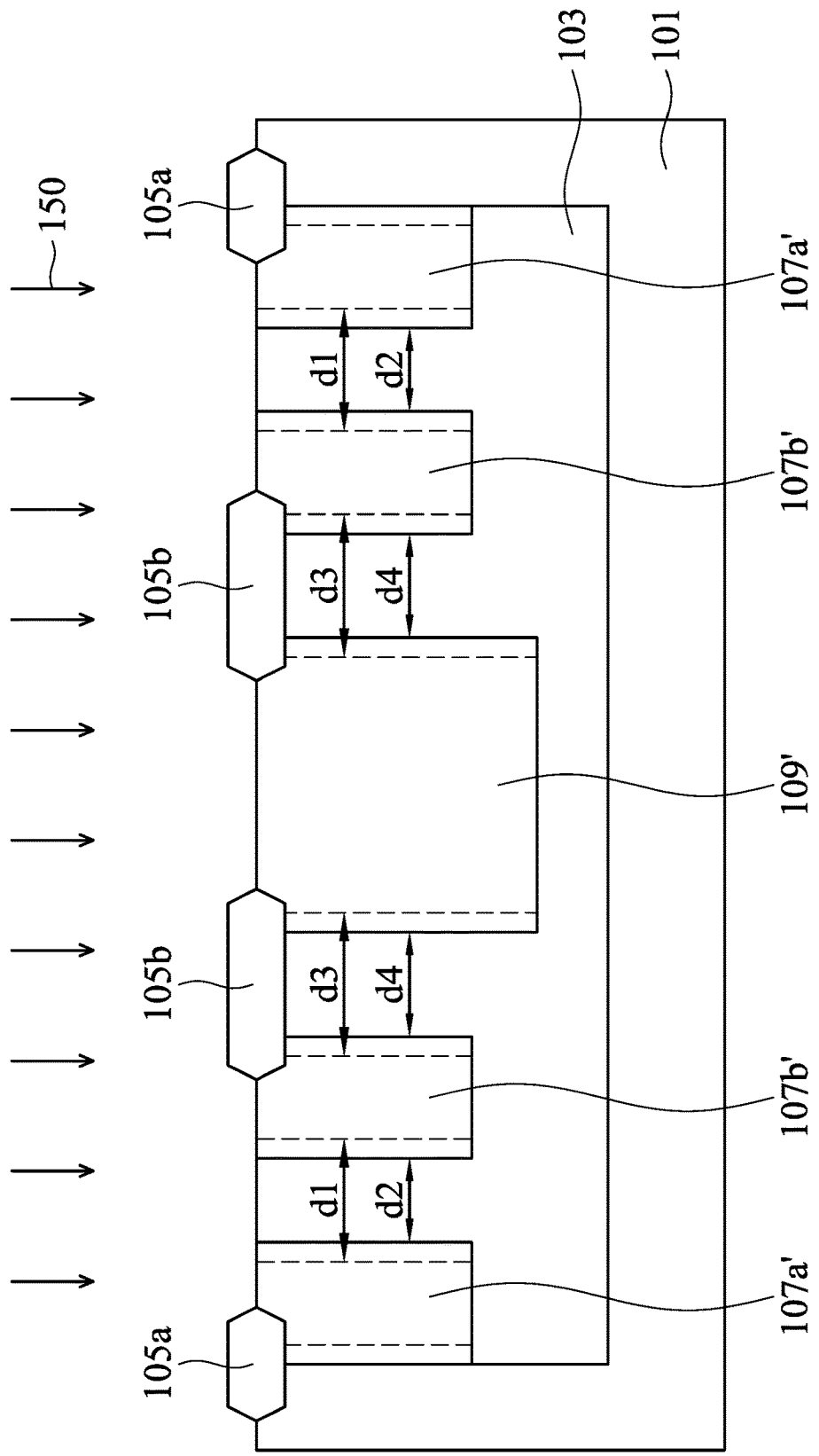

As shown in FIG. 5, a rapid thermal annealing process 150 is performed on the structure shown in FIG. 4, so that the dopants of the second well regions 107a, 107b and the third well regions 109 can diffuse outward, in accordance with some embodiments. Second well regions 107a', 107b' and a third well region 109' with enlarged regions are formed by performing the rapid thermal annealing process 150. FIG. 5 shows lateral diffusions of the dopants in the well regions, wherein the first distances d1 between any two of the adjacent second well regions 107a and 107b are reduced to second distances d2 after performing the rapid thermal annealing process 150, and the third distances d3 between the third well region 109 and the adjacent second well regions 107b are reduced to fourth distances d4 after performing the rapid thermal annealing process 150.

In some embodiments, the duration of the rapid thermal annealing process 150 is in a range from about 20 seconds to about 60 seconds. In some embodiments, the temperature of the rapid thermal annealing process 150 is in a range from about 900° C. to about 1100° C. In some embodiments, the second distances d2 and the fourth distances d4 are in a range from about 0.6 μm to 1.2 μm.

Figure 6:
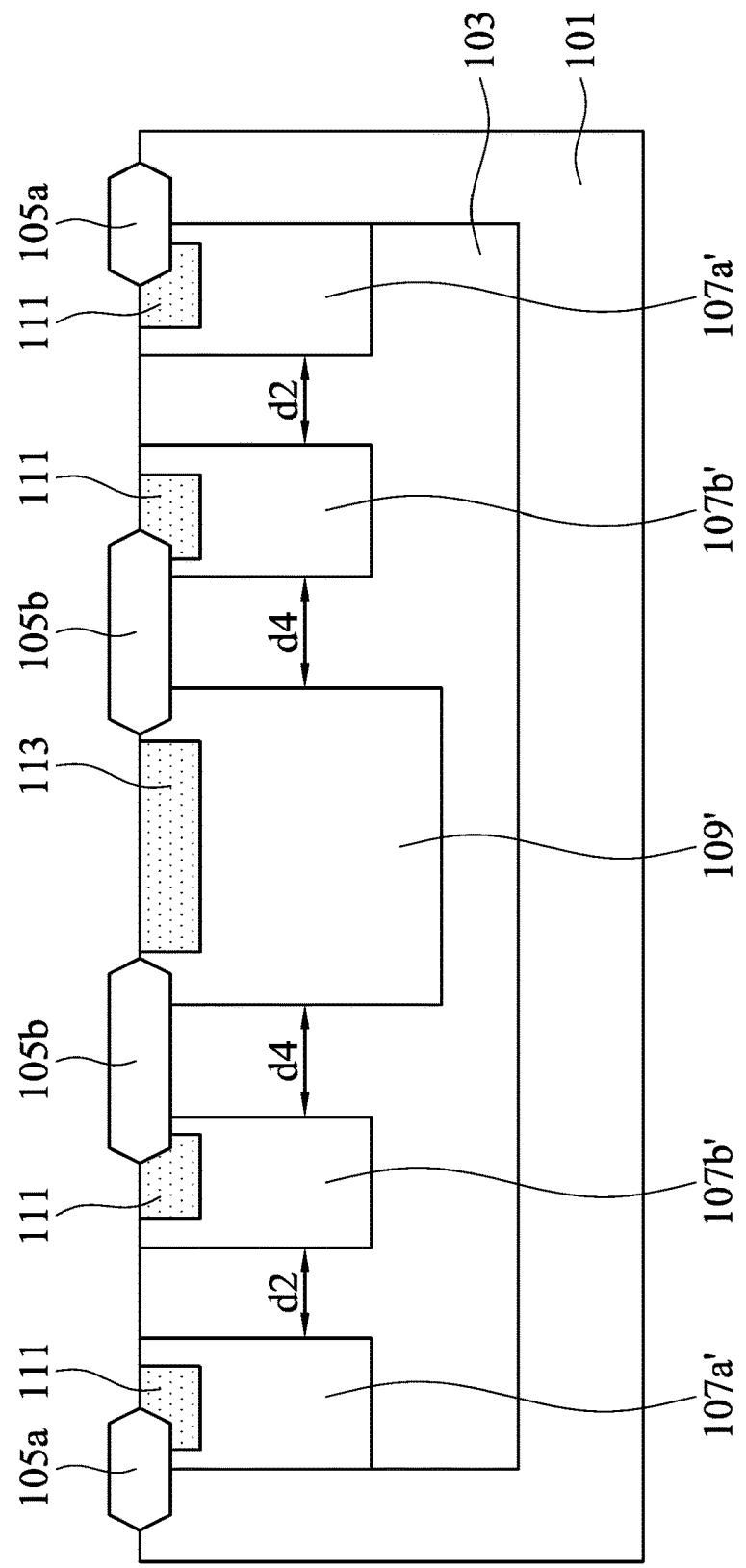

Next, as shown in FIG. 6, first doped regions 111 are formed in the second well regions 107a' and 107b' respectively, and a second doped region 113 is formed in the third well region 109'. In some embodiments, only one first doped region 111 is disposed in any one of the second well regions 107a', and portions of the first doped regions 111 are located under two adjacent isolation structures 105a and 105b. The first doped regions 111 in the present embodiment are heavily doped p-type regions, and the second doped region 113 in the present embodiment is a heavily doped n-type region. In other embodiments, the first doped regions 111 may be heavily doped n-type regions, and the second doped region 113 is a heavily doped p-type region.

Figure 7:
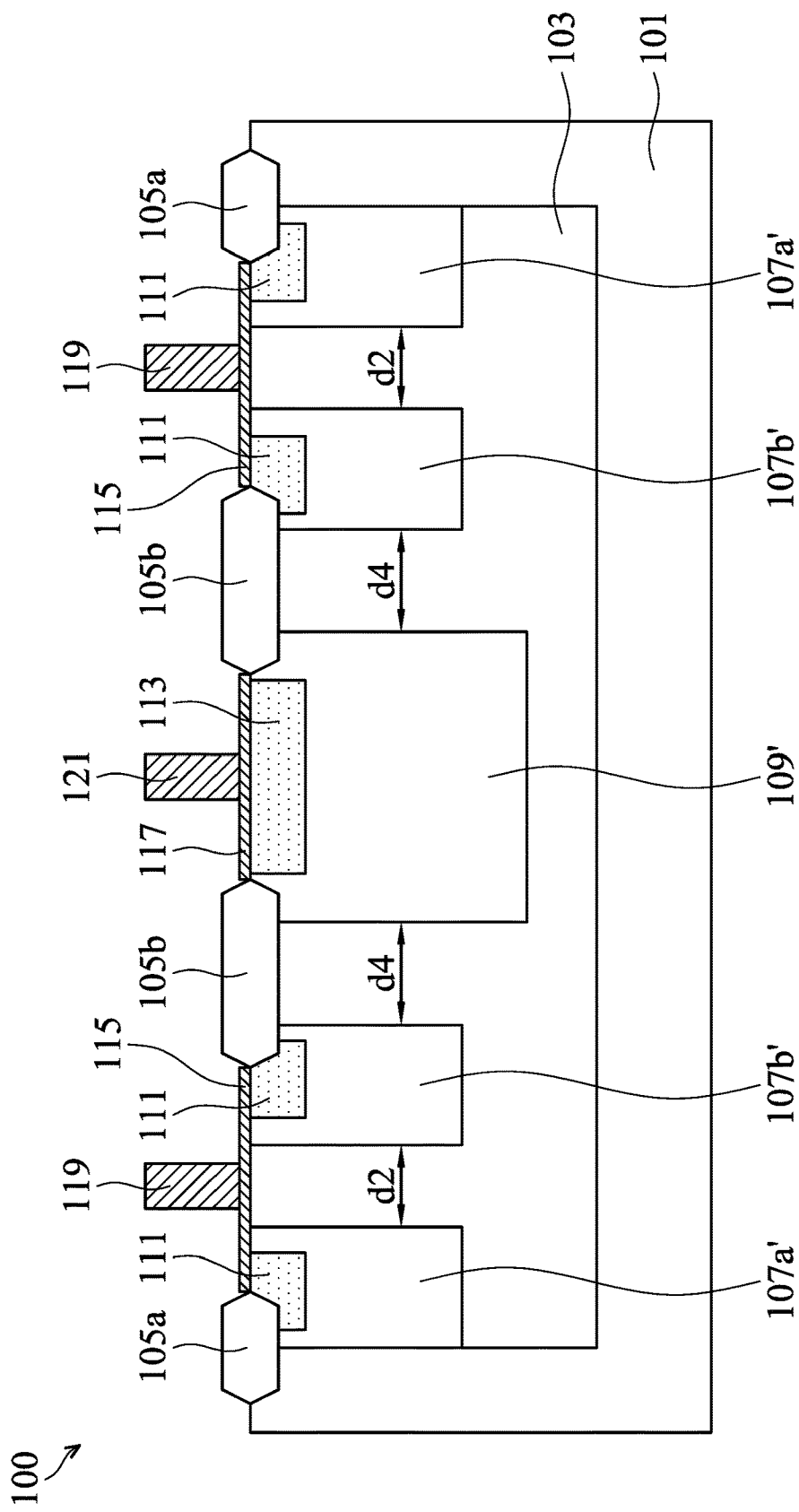

As shown in FIG. 7, some first barrier metal layers 115, which are located in the same horizontal direction, are formed on the first well region 103, in accordance with some embodiments. In some embodiments, the first barrier metal layers 115 cover the areas between the isolation structures 105a and the adjacent isolation structure 105b of the semiconductor device 100. In some embodiments, the semiconductor device 100 may be a Schottky diode, and the above-mentioned areas are, for example, the anode/cathode electrode regions of the Schottky diode. In other words, the first barrier metal layers 115 cover portions of two adjacent first doped regions 111, portions of two adjacent second well regions 107a' and 107b', and the first well region 103 between the above-mentioned two adjacent second well regions 107a' and 107b'.

In some embodiments, a second barrier metal layer 117 is formed on the first well region 103, wherein the second barrier metal layer 117 covers the area between two adjacent isolation structures 105b of the semiconductor device 100. In some embodiments, the semiconductor device 100 may be a Schottky diode, and the above-mentioned areas are, for example, the anode/cathode electrode regions of the Schottky diode. In other words, the second barrier metal layer 117 covers the second doped region 113. In some embodiments, the second barrier metal layer 117 fully covers the second doped region 113 and a portion of the third well region 109' around the second doped region 113.

Moreover, the first barrier metal layers 115 and the second barrier metal layer 117 are formed by chemical vapor deposition (CVD), physical vapor deposition (PVD), atomic layer deposition (ALD), electroplating, sputtering, or other applicable processes. In some embodiments, for semiconductor devices manufactured in a Bipolar-CMOS-DMOS (BCD) process, for example, Schottky diode, the first barrier metal layers 115 and the second barrier metal layer 117 are formed by a self-alignment salicide process.

Moreover, as shown in FIG. 7, first electrodes 119 are formed on the first metal barrier layers 115 respectively, and a second electrode 121 is formed on the second metal barrier layer 117. In some embodiments, the first electrodes 119 and the second electrode 121 are formed by chemical vapor deposition, physical vapor deposition, atomic layer deposition, electroplating, sputtering, or other applicable processes. In some embodiments, for semiconductor devices manufactured in a BCD process, for example, a Schottky diode, the first electrodes 119 and the second electrodes 121 are made of aluminum. The semiconductor device 100 of the present embodiment, for example, a Schottky diode, has two first electrodes 119 which can operate as anodes and a second electrode 121 which can operate as a cathode. In other embodiments, the anodes and cathodes may have different configurations.

The foregoing is using Schottky diodes manufactured by a BCD process as embodiments to specify the concept of the present disclosure. The methods for forming the semiconductor devices in the present disclosure can also be applied to other types of semiconductor devices, so that the distances between well regions can be reduced and precisely controlled.

Schottky diodes have Schottky barriers formed at metal-semiconductor junctions, which gives them advantages such as low turn-on voltage under forward bias and higher switching speed, so that Schottky diodes are usually used in power management integrated circuit design in order to increase the power conversion efficiency. However, Schottky diodes have problems such as high reverse-bias leakage current and the reverse-bias leakage current may rise rapidly as the temperature increases, especially for the Schottky diodes formed by the BCD process.

In the semiconductor devices of the present embodiments, a rapid thermal annealing (RTA) process is utilized in manufacturing the Schottky diodes to replace the traditional diffusion process, so that lateral diffusions of the well regions in the semiconductor substrates can be precisely controlled, and the distances between well regions can be reduced. For example, the distances between the well regions in the devices using a conventional diffusion process are in a range from about 2 µm to about 4 µm. However, the distances between the well regions in the devices using a rapid thermal annealing process in the present disclosure are in a range from about 0.6 µm to about 1.2 µm. As a result, the Schottky contact areas of the devices can be reduced, and thus the overall sizes of the Schottky diodes can be reduced to about 70%-80% of that of the devices using conventional diffusion process.

Furthermore, Since the Schottky diodes in the embodiments of the present disclosure have smaller Schottky contact areas, the reverse-bias leakage current can be very low at both room temperature and high temperature (up to about 150° C.). Moreover, there is no need to use additional ion implantations and masks during the process of manufacturing the devices. Therefore, the cost of the process for the devices can be reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first well region disposed in a semiconductor substrate;
    a plurality of isolation structures disposed on the semiconductor substrate;
    a plurality of second well regions, and a third well region disposed in the first well region and in-between the second well regions, wherein the second well regions are isolated from the third well region by the isolation structures, and a distance between two of the adjacent second well regions is in a range from 0.6 µm to 1.2 µm;
    a plurality of first barrier metal layers disposed on the first well region, covering the second well regions;
    a second barrier metal layer disposed on the first well region, covering the third well region;
    a plurality of first electrodes disposed on the respective first barrier metal layers;
    a second electrode disposed on the second barrier metal layer; and
    a plurality of first doped regions disposed in the second well regions respectively; and
    a second doped region disposed in the third well region, wherein the first barrier metal layers cover the first doped regions, and the second barrier metal layer covers the second doped region, and wherein the first well region, the third well region and the second doped region have a first conductivity type, and the second well regions and the first doped regions have a second conductivity type opposite to the first conductivity type.

2. The semiconductor device as claimed in claim 1, wherein a distance between the third well region and the adjacent second well region is in a range from 0.6 μm to 1.2 μm.

3. The semiconductor device as claimed in claim 1, wherein the first barrier metal layers and the second barrier metal layer are made of a self-aligned silicide.

4. The semiconductor device as claimed in claim 1, wherein the first electrodes and the second electrode are made of aluminum.

5. A method for forming the semiconductor device as claimed in claim 1, comprising:
   forming a first well region in a semiconductor substrate;
   forming a plurality of isolation structures on the semiconductor substrate;
   forming a plurality of second well regions and a third well region in the first well region, wherein the second well regions are isolated from the third well region by the isolation structures, and two of the adjacent second well regions have a first distance between them;
   performing a rapid thermal annealing process to shorten the first distance to a second distance;
   forming a plurality of first barrier metal layers on the first well region and covering the second well regions;
   forming a second barrier metal layer on the first well region and covering the third well region;
   forming a plurality of first electrodes on the respective first barrier metal layers;
   forming a second electrode on the second barrier metal layer;
   forming a plurality of first doped regions in the second well regions respectively; and
   forming a second doped region in the third well region, wherein the first barrier metal layers cover the first doped regions, and the second barrier metal layer covers the second doped region, and wherein the first well region, the third well region and the second doped region have a first conductivity type, and the second well regions and the first doped regions have a second conductivity type opposite to the first conductivity type.

6. The method as claimed in claim 5, wherein the rapid thermal annealing process has a duration, and the duration is in a range from 20 seconds to 60 seconds.

7. The method as claimed in claim 5, wherein the rapid thermal annealing process is operated at a temperature in a range from 900° C. to 1100° C.

8. The method as claimed in claim 5, wherein the second distance is in a range from 0.6 μm to 1.2 μm.

9. The method as claimed in claim 5, wherein the second well regions and the third well region are formed by two different ion implantation processes.

10. The method as claimed in claim 5, wherein the first barrier metal layers and the second barrier metal layer are formed by a self-aligned silicidation process.

11. The method as claimed in claim 5, wherein the first electrodes and the second electrode are formed from aluminum.

12. The method as claimed in claim 5, wherein the third well region and the adjacent second well region have a third distance between them before performing the rapid thermal annealing process, and the third distance is shortened to a fourth distance by performing the rapid thermal annealing process.

13. The method as claimed in claim 12, wherein the fourth distance is in a range from 0.6 μm to 1.2 μm.

* * * * *